US010381316B2

(12) United States Patent
Chung et al.

(10) Patent No.: US 10,381,316 B2
(45) Date of Patent: Aug. 13, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Chia-Liang Chung, Kaohsiung (TW); Pei-Ling Li, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/591,855

(22) Filed: May 10, 2017

(65) Prior Publication Data

US 2018/0331050 A1 Nov. 15, 2018

(51) Int. Cl.

| | |
|---|---|
| ***H01L 23/66*** | (2006.01) |
| ***H01L 23/06*** | (2006.01) |
| ***H01L 23/00*** | (2006.01) |
| ***H01L 23/552*** | (2006.01) |
| ***H01L 21/52*** | (2006.01) |
| ***H01L 21/48*** | (2006.01) |
| ***H01L 21/683*** | (2006.01) |
| ***H01L 23/31*** | (2006.01) |
| ***H01L 21/56*** | (2006.01) |

(52) U.S. Cl.

CPC .......... *H01L 23/66* (2013.01); *H01L 21/4817* (2013.01); *H01L 21/52* (2013.01); *H01L 21/568* (2013.01); *H01L 21/6835* (2013.01); *H01L 23/06* (2013.01); *H01L 23/3121* (2013.01); *H01L 23/552* (2013.01); *H01L 24/49* (2013.01); *H01L 2223/6677* (2013.01); *H01L 2224/48091* (2013.01); *H01L 2924/00014* (2013.01)

(58) Field of Classification Search

CPC ..... H01L 23/66; H01L 21/4817; H01L 21/52; H01L 21/6835; H01L 23/06; H01L 23/552; H01L 24/49; H01L 2223/6677; H01L 2224/48091

USPC .......................................................... 257/531

See application file for complete search history.

(56) References Cited

U.S. PATENT DOCUMENTS

| | | | | |
|---|---|---|---|---|
| 6,686,649 B1 | 2/2004 | Mathews et al. | | |
| 7,049,682 B1 | 5/2006 | Mathews et al. | | |
| 8,199,518 B1 | 6/2012 | Chun et al. | | |
| 10,230,152 B2 * | 3/2019 | Chiu | .................... | H01Q 1/2283 |

* cited by examiner

*Primary Examiner* — Hrayar A Sayadian

(74) *Attorney, Agent, or Firm* — Foley & Lardner LLP; Cliff Z. Liu

(57) ABSTRACT

The disclosure relates to a semiconductor package device. The semiconductor package device includes a substrate having a first surface and a second surface opposite to the first surface and including a first conductive contact. The semiconductor package device further includes an electronic component disposed on the first surface of the substrate. The semiconductor package device further includes a metal frame disposed on the first surface of the substrate. The semiconductor package device further includes an antenna disposed on the metal frame, wherein the antenna is electrically isolated from the metal frame and electrically connected to the first conductive contact of the substrate.

19 Claims, 12 Drawing Sheets

SEMICONDUCTOR PACKAGE DEVICE AND METHOD OF MANUFACTURING THE SAME

BACKGROUND

1. Technical Field

The present disclosure relates to a semiconductor package device and a method of manufacturing the same, and more particularly, to a semiconductor package device including an antenna and a method of manufacturing the same.

2. Description of the Related Art

Wireless communication devices, such as cell phones, typically include antennas for transmitting and receiving radio frequency (RF) signals. Comparably, a wireless communication device includes an antenna and a communication module, each disposed on different parts of a circuit board. Under the comparable approach, the antenna and the communication module are separately manufactured and electrically connected together after being placed on the circuit board. Accordingly, separate manufacturing costs may be incurred for both components. Furthermore, it may be difficult to reduce a size of the wireless communication device to attain a suitably compact product design. In addition, an RF signal transmission path between the antenna and the communication module may be long, thereby reducing quality of a signal transmitted between the antenna and the communication module.

SUMMARY

In accordance with some embodiments of the present disclosure, a semiconductor package device includes a substrate having a first surface and a second surface opposite to the first surface and including a first conductive contact. The semiconductor package device further includes an electronic component disposed on the first surface of the substrate. The semiconductor package device further includes a metal frame disposed on the first surface of the substrate. The semiconductor package device further includes an antenna disposed on the metal frame, wherein the antenna is electrically isolated from the metal frame and electrically connected to the first conductive contact of the substrate.

In accordance with some embodiments of the present disclosure, a method of manufacturing a semiconductor package device includes providing a substrate including a first surface and a second surface opposite to the first surface. The method further includes disposing an electronic component on the first surface of the substrate. The method further includes attaching a metal frame, on which an antenna is disposed and from which the antenna is electrically isolated, on the first surface of the substrate through a first conductive contact so that the antenna is electrically connected to the substrate through the first conductive contact.

In accordance with some embodiments of the present disclosure, a method of manufacturing a semiconductor package device includes providing a carrier. The method further includes disposing a metal frame on the carrier, wherein the metal frame has an antenna disposed thereon and the antenna is electrically isolated from the metal frame. The method further includes disposing an electronic component on the carrier and adjacent to the metal frame. The method further includes disposing a package body over the carrier. The method further includes removing the carrier. The method further includes disposing an interconnection structure over the package body, the interconnection structure being electrically connected to the metal frame, the antenna and the electronic component.

Figure 1:
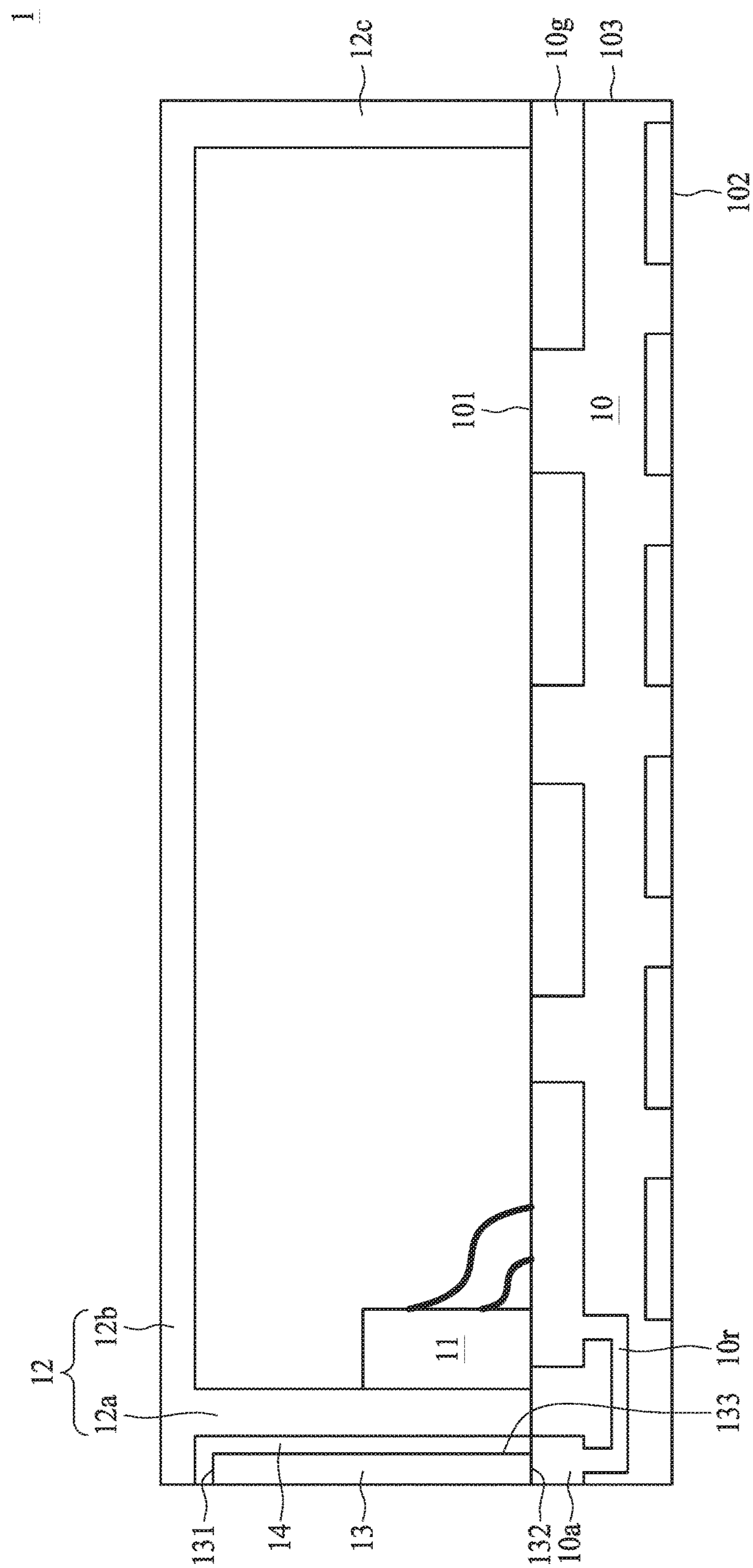
FIG. 1 illustrates a cross-sectional view of a semiconductor package device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1 illustrates a cross-sectional view of a semiconductor package device 1 in accordance with some embodiments of the present disclosure. The semiconductor package device 1 includes a substrate 10, an electronic component 11, a metal frame 12, an antenna 13 and an insulating layer 14.

The substrate 10 may be, for example, a printed circuit board, such as a paper-based copper foil laminate, a composite copper foil laminate, or a polymer-impregnated glass-fiber-based copper foil laminate. The substrate 10 may include opposite surfaces 101, 102 and a lateral surface 103 extending between the surfaces 101, 102. In some embodiments, the surface 101 of the substrate 10 is referred to as a top surface or a first surface and the surface 102 of the substrate 10 is referred to as a bottom surface or a second surface. The substrate 10 may include an interconnection structure (e.g., electrical connection) **10*r*, such as a redistribution layer (RDL) or a grounding element (or grounding segment) 10*g*. In some embodiments, the grounding element 10*g* may be a via, a metal layer or a metal trace exposed from the surface 101 or the lateral surface 103 of the substrate 10**.

The electronic component 11 is disposed on the surface 101 of the substrate 10. In some embodiments, the electronic component 11 may be an active electronic component, such as an integrated circuit (IC) chip or a die. Alternatively, the electronic component 11 may be a passive electronic component, such as a capacitor, a resistor or an inductor. In some embodiments, the electronic component 11 is vertically disposed on the surface 101 of the substrate 10 and adjacent to the metal frame 12. For example, a backside (or back surface) or an active side (or active surface) of the electronic component 11 is substantially perpendicular to the surface 101 of the substrate 10. In some embodiments, the electronic component has a side surface extending between the back surface and the active surface. The electronic component 11 may be electrically connected to the substrate 10 (e.g., to the RDL) by wire-bond, conductive adhesive or solder balls. By vertically disposing the electronic component 11 on the surface 101 of the substrate 10, the area (e.g., X-Y dimension) of the semiconductor package device can be reduced. In other embodiments, the electronic component 11 can be arranged so that the backside of the electronic component 11 is substantially parallel to the surface 101 of the substrate 10.

The metal frame 12 is disposed on the surface 101 of the substrate 10 and covers the electronic component 11. The metal frame 12 includes portions 12*a*, 12*b* and 12*c*. The portion 12*a* of the metal frame 12 is substantially perpendicular to the surface 101 of the substrate 10. The portion 12*c* of the metal frame 12 is substantially perpendicular to the surface 101 of the substrate 10 and physically separated from the portion 12*a* of the metal frame 12. The portion 12*b* of the metal frame 12 is substantially perpendicular to the portions 12*a*, 12*c* of the metal frame 12 and electrically connected to the portion 12*a* of the metal frame 12 and to the portion 12*c* of the metal frame 12. In some embodiments, the portion 12*b* protrudes beyond the portion 12*a* in a direction substantially parallel to the surface 101 of the substrate 10.

The metal frame 12 (e.g., the portion 12*c*) is electrically connected to the grounding element 10*g* of the substrate 10 to provide electromagnetic interference (EMI) shielding. For example, the metal frame 12 can prevent the electronic component 11 from being interfered with by electromagnetic waves radiated from other electronic components external to the metal frame (e.g., the antenna 13 or other circuits operated in a high frequency). In some embodiments, the metal frame 12 is a conductive thin film, and may include, for example, aluminum (Al), copper (Cu), chromium (Cr), tin (Sn), gold (Au), silver (Ag), nickel (Ni) or stainless steel, or a mixture, an alloy, or other combination thereof. The metal frame 12 may include a single conductive layer or multiple conductive layers. In some embodiments, the metal frame 12 includes multiple conductive layers, and the multiple conductive layers may include a same material, or ones of the multiple conductive layers may include different materials, or each of the multiple conductive layers may include different materials from others of the multiple conductive layers. In some embodiments, each conductive layer of the metal frame 12 has a thickness of up to about 200 micrometers (μm), such as up to about 150 μm, up to about 100 μm, up to about 50 μm, up to about 10 μm, up to about 5 μm, up to about 1 μm, or up to about 500 nanometers (nm), and down to about 100 nm or less, down to about 50 nm or less, or down to about 10 nm or less. In some embodiments, the metal frame 12 includes multiple conductive layers, and different conductive layers may have different thicknesses.

The antenna 13 is disposed on the surface 101 of the substrate 10. The antenna 13 is adjacent to the portions 12*a*, 12*b* of the metal frame 12 and isolated from the portions 12*a*, 12*b* of the metal frame 12 by the insulating layer 14. For example, the antenna 13 is disposed on the portion 12*a* of the metal frame 12 and isolated from the portions 12*a*, 12*b* of the metal frame 12 by the insulating layer 14. For example, the antenna 13 is embedded into the portion 12*a* of the metal frame 12 and electrically insulated from the metal frame 12 by the insulating layer 14. The antenna 13 is, or includes, a conductive material such as a metal or metal alloy. Examples of the conductive material include Au, Ag, Al, Cu, or an alloy thereof.

The antenna 13 includes a top surface 131, a bottom surface 132 opposite to the top surface 131 and a lateral surface 133 extending between the top surface 131 and the bottom surface 132. The top surface 131 and the lateral surface 133 of the antenna 13 are covered by the insulating layer 14 to prevent the antenna 13 from contacting the metal frame 12. The bottom surface 132 of the antenna 13 is exposed from the insulating layer 14. The bottom surface 132 of the antenna 13 directly contacts a conductive pad (e.g., a conductive contact or first conductive contact) 10*a* of the substrate 10, and thus a signal can be transmitted between the antenna 13 and the electronic component 11 through the interconnection structure 10*r* of the substrate 10. In some embodiments, the electronic component 11 is electrically connected to the substrate 10 (e.g., to the interconnection structure 10*r*) via a second conductive contact. Directly connecting the antenna 13 to the conductive pad 10*a* and the interconnection structure 10*r* of the substrate 10 without using any feeding element can shorten the signal transmission path between the antenna 13 and the electronic component 11, which would in turn reduce signal loss during transmission (e.g., especially for high frequency signals) and increase the performance of the semiconductor package device 1.

In some comparable semiconductor package devices integrated with an antenna, the antenna and electronic components are disposed on the substrate side by side, which would increase the total area (e.g., X-Y dimension) of the semiconductor package device. In accordance with some embodiments, the antenna 13 is formed or disposed on the metal frame 12 (or embedded into the metal frame 12), and thus the total area of the semiconductor package device 1 can be reduced. In addition, by placing the antenna 13 on the metal frame 12, the antenna 13 is closer to the electronic component 11. Reducing the distance between the antenna 13 and the electronic component 11 can reduce signal loss during transmission, which would in turn increase the performance of the semiconductor package device 1.

Figure 2:
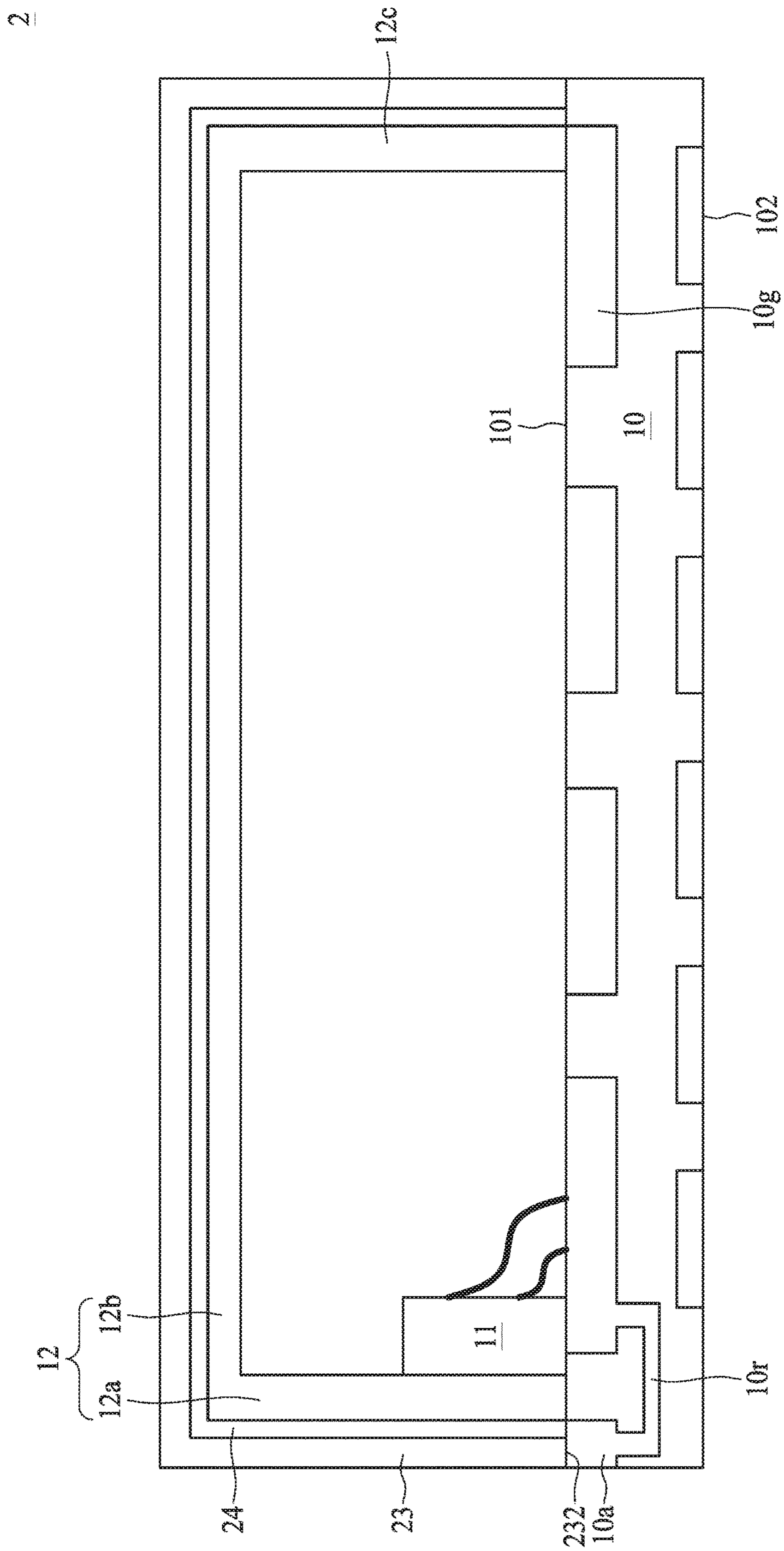
FIG. 2 illustrates a cross-sectional view of a semiconductor package device in accordance with some embodiments of the present disclosure.

FIG. 2 illustrates a cross-sectional view of a semiconductor package device 2 in accordance with some embodiments of the present disclosure. The semiconductor package device 2 is similar to the semiconductor package device 1 shown in FIG. 1 except that an antenna 23 of the semiconductor package device 2 is disposed on all of the portions 12*a*, 12*b* and 12*c* of the metal frame 12.

The antenna 23 is disposed on external surfaces (including the portions 12*a*, 12*b* and 12*c*) of the metal frame 12 and isolated from the metal frame 12 through an insulating layer 24. For example, the antenna 23 and the insulating layer 24 are conformal to the metal frame 12. A bottom surface 232 of the antenna 23 directly contacts the conductive pad 10*a* of the substrate 10, and thus signals can be transmitted between the antenna 23 and the electronic component 11 through the interconnection structure 10*r* of the substrate 10. Disposing the antenna 23 on all external surfaces of the metal frame 12 could increase the radiation directions (e.g., X, Y and Z directions), which would increase the performance of the semiconductor package device 2.

Figure 3:
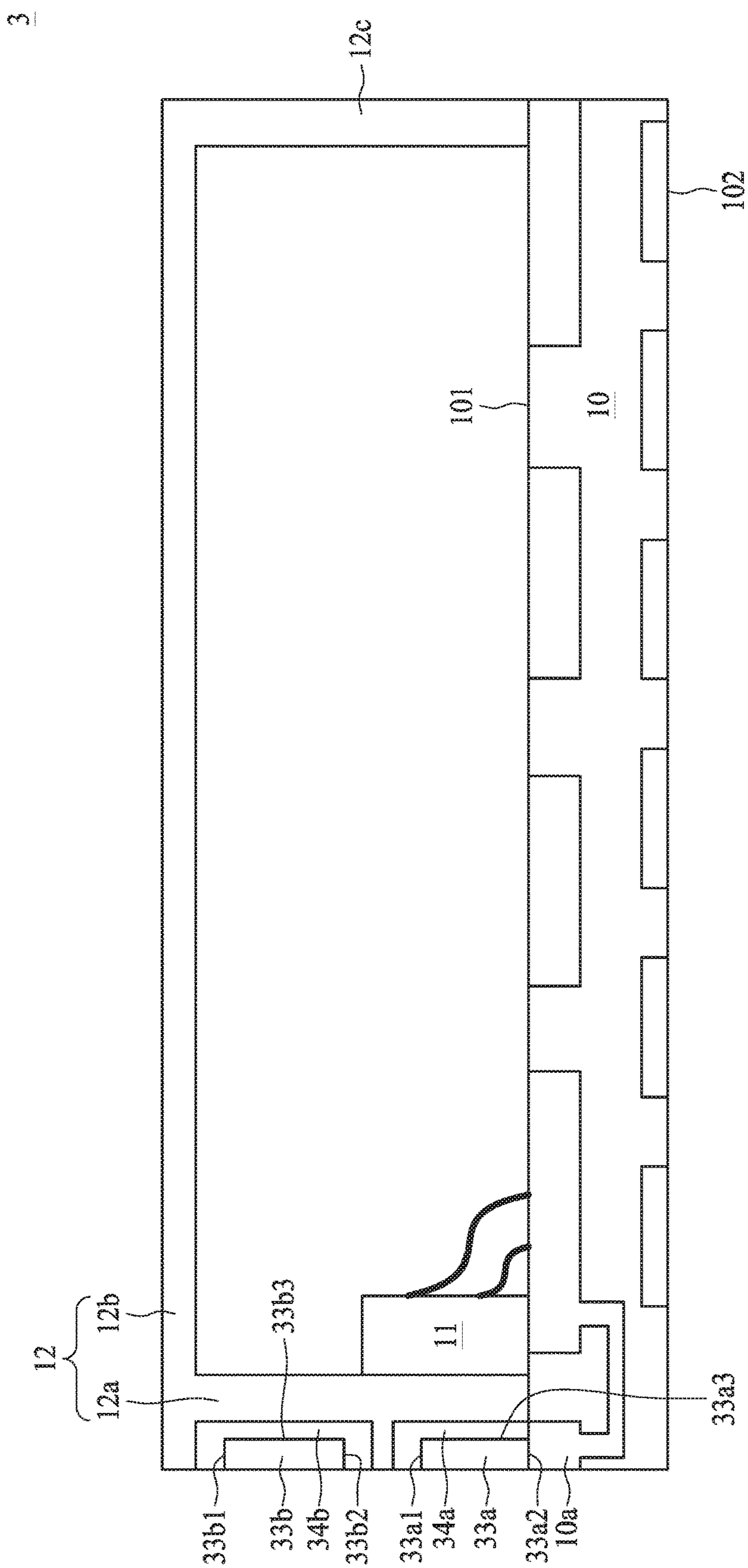
FIG. 3 illustrates a cross-sectional view of a semiconductor package device in accordance with some embodiments of the present disclosure.

FIG. 3 illustrates a cross-sectional view of a semiconductor package device 3 in accordance with some embodiments of the present disclosure. The semiconductor package device 3 is similar to the semiconductor package device 1 shown in FIG. 1 except that there are two antennas 33*a*, 33*b* disposed on the portion 12*a* of the metal frame 12.

The antenna 33*a* is disposed on the surface 101 of the substrate 10. The antenna 33*a* is adjacent to the metal frame 12 and isolated from the metal frame 12 by an insulating layer 34*a*. For example, the antenna 33*a* is disposed on the portion 12*a* of the metal frame 12 and isolated from the portion 12*a* of the metal frame 12 by the insulating layer 34*a*. For example, the antenna 33*a* is embedded into the portion 12*a* of the metal frame 12 and electrically insulated from the metal frame 12 by the insulating layer 34*a*. The antenna 33*a* includes a top surface 33*a*1, a bottom surface 33*a*2 opposite to the top surface 33*a*1 and a lateral surface 33*a*3 extending between the top surface 33*a*1 and the bottom surface 33*a*2. The top surface 33*a*1 and the lateral surface 33*a*3 of the antenna 33*a* are covered by the insulating layer 34*a* to prevent the antenna 33*a* from contacting the metal frame 12. The bottom surface 33*a*2 of the antenna 33*a* is exposed from the insulating layer 34*a*. The bottom surface 33*a*2 of the antenna 33*a* directly contacts a conductive pad 10*a* of the substrate 10, and thus signals can be transmitted between the antenna 33*a* and the electronic component 11 through the interconnection structure 10*r* of the substrate 10.

The antenna 33*b* is disposed over the antenna 33*a* and separated (e.g., physically separated) from the antenna 33*a*. The antenna 33*b* is adjacent to the metal frame 12 and isolated from the metal frame 12 by the insulating layer 34*b*. For example, the antenna 33*b* is disposed on the portion 12*a* of the metal frame 12 and isolated from the portion 12*a* of the metal frame 12 by the insulating layer 34*b*. For example, the antenna 33*b* is embedded into the portion 12*a* of the metal frame 12 and electrically insulated from the metal frame 12 by the insulating layer 34*b*. The antenna 33*b* includes a top surface 33*b*1, a bottom surface 33*b*2 opposite to the top surface 33*b*1 and a lateral surface 33*b*3 extending between the top surface 33*b*1 and the bottom surface 33*b*2. The top surface 33*b*1, the bottom surface 33*b*2 and the lateral surface 33*b*3 of the antenna 33*b* are covered by the insulating layer 34*b*. The antenna 33*b* is directly or indirectly connected to the substrate 10 so that signals can be transmitted between the antenna 33*b* and the electronic component 11 through the substrate 10.

In some embodiments, there can be any number (e.g., more than 2) of antennas disposed on the portion 12*a* of the metal frame 12 depending on different embodiments. In some embodiments, there is an antenna array disposed on the portion 12*a* of the metal frame 12. In some embodiments, the antenna array can be disposed on the portion 12*a*, the portion 12*b* and/or the portion 12*c* of the metal frame 12 depending on design specifications. Increasing the number of the antenna may increase the intensity of the radiation, which would in turn increase the performance of the semiconductor package device 3.

Figure 4:
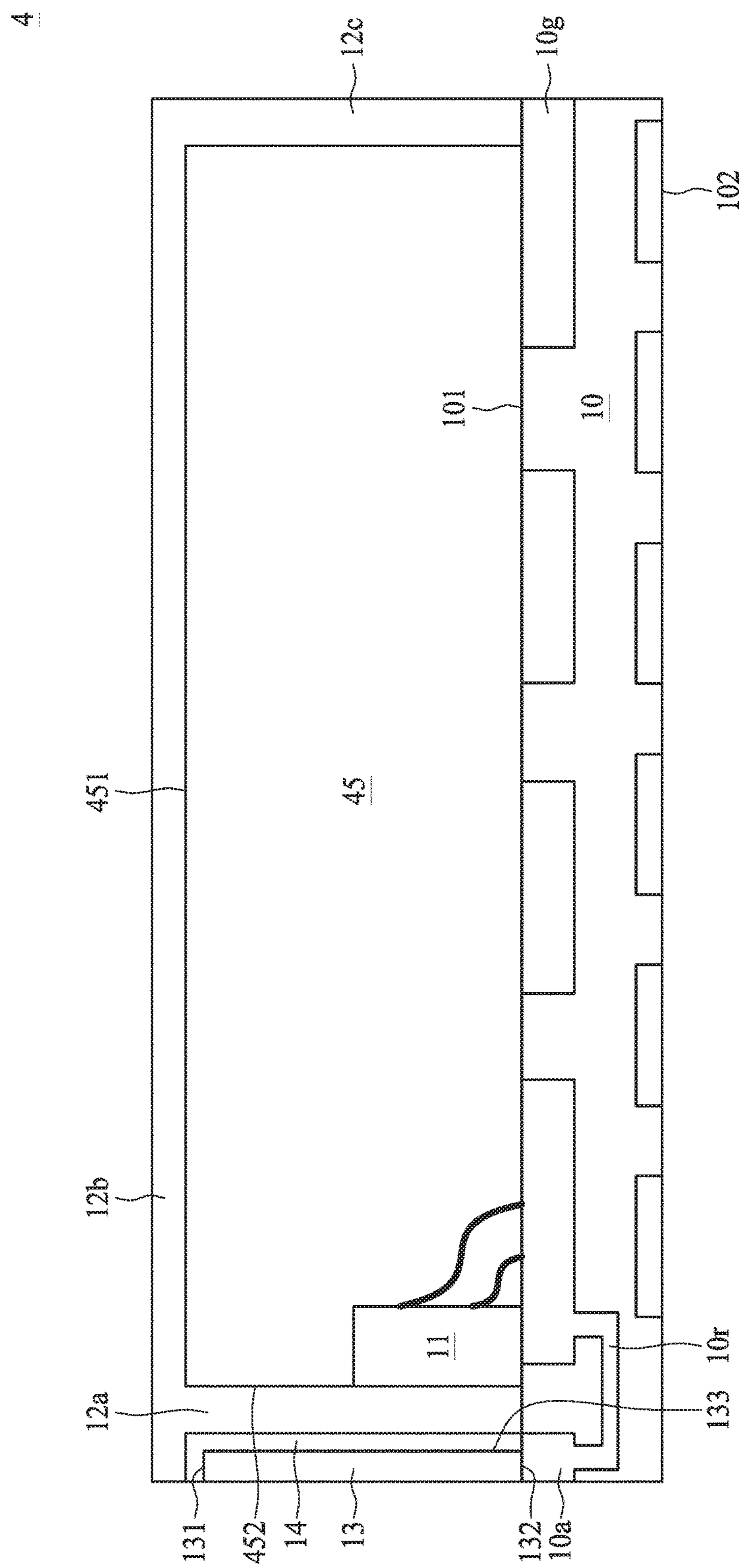
FIG. 4 illustrates a cross-sectional view of a semiconductor package device in accordance with some embodiments of the present disclosure.

FIG. 4 illustrates a cross-sectional view of a semiconductor package device 4 in accordance with some embodiments of the present disclosure. The semiconductor package device 4 is similar to the semiconductor package device 1 shown in FIG. 1 except that the semiconductor package device 4 further includes a package body 45.

The package body 45 is disposed on the surface 101 of the substrate 10 and encapsulates the electronic component 11. Lateral surfaces 452 of the package body 45 contact the portions 12*a*, 12*c* of the metal frame 12 and a top surface 451 of the package body 45 contacts the portion 12*b* of the metal frame 12. In some embodiments, the package body 45 includes an epoxy resin including fillers, a molding compound (e.g., an epoxy molding compound or other molding compound), a polyimide, a phenolic compound or material, a material with a silicone dispersed therein, or a combination thereof.

Figure 5:
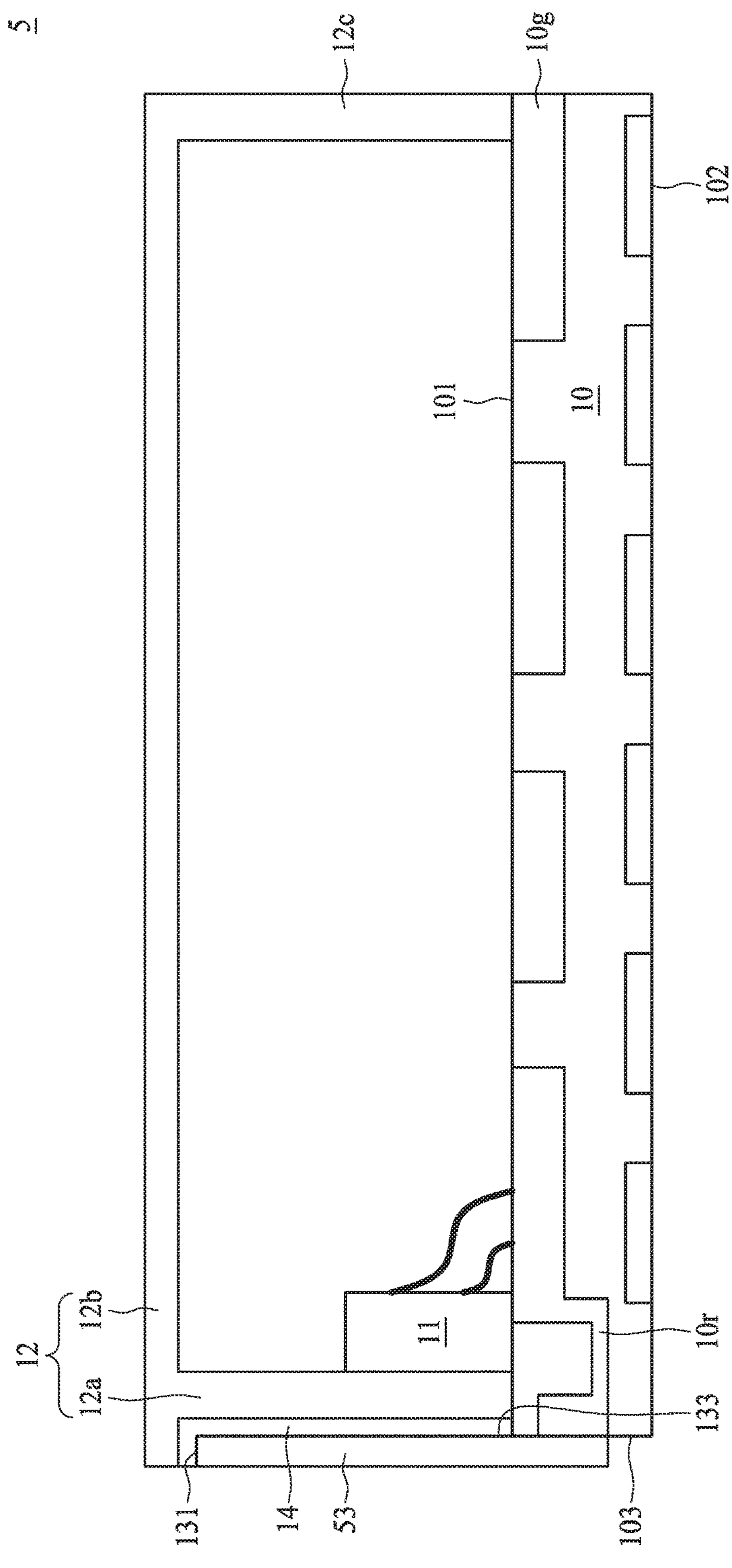
FIG. 5 illustrates a cross-sectional view of a semiconductor package device in accordance with some embodiments of the present disclosure.

FIG. 5 illustrates a cross-sectional view of a semiconductor package device 5 in accordance with some embodiments of the present disclosure. The semiconductor package device 5 is similar to the semiconductor package device 1 shown in FIG. 1 except that a portion of an antenna 53 of the semiconductor package device 5 extends along the lateral surface 103 of the substrate 10.

As shown in FIG. 5, the antenna 53 is not coplanar with the lateral surface 103 of the substrate 10. For example, the antenna 53 extends along the portion 12*a* of the metal frame 12 and the lateral surface 103 of the substrate 10 to directly contact the interconnection structure 10*r* of the substrate 10 that is exposed from the lateral surface 103 of the substrate 10.

Figure 6A:
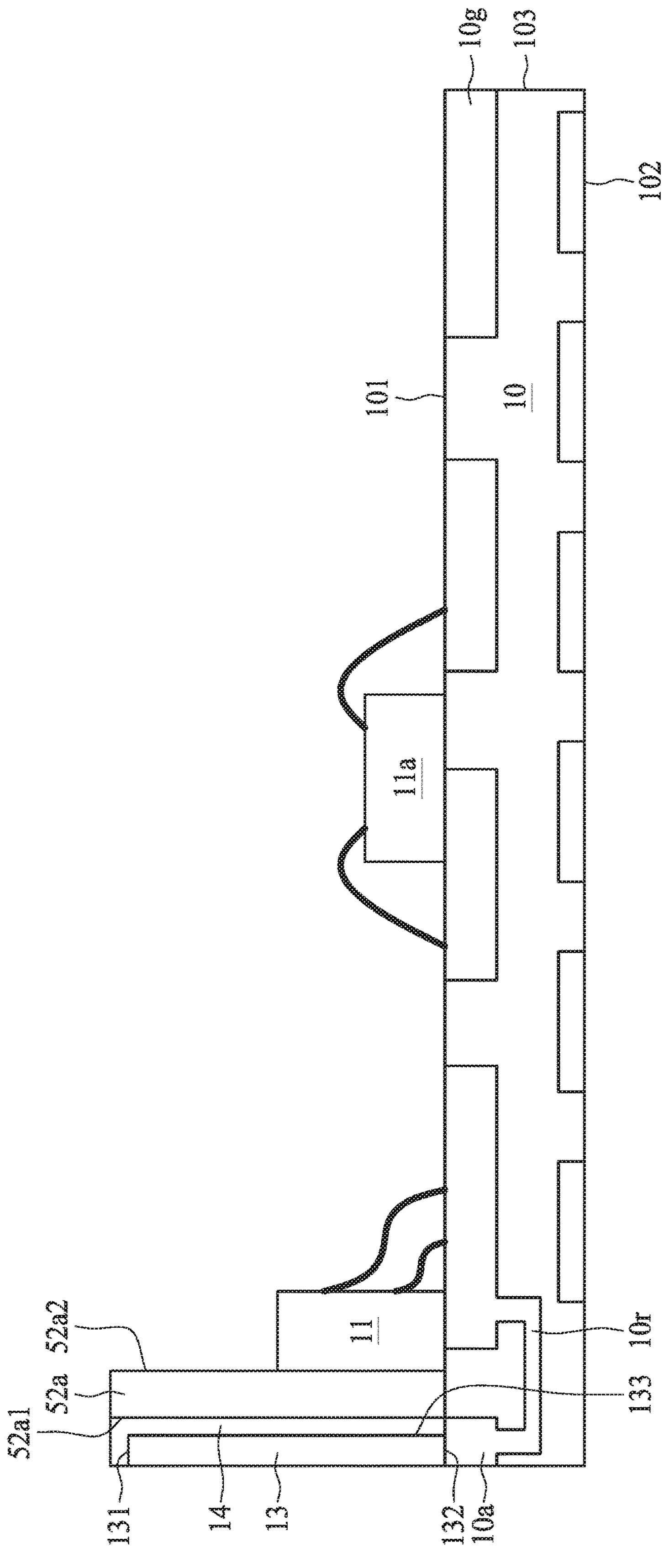
FIG. 6A, FIG. 6B and FIG. 6C illustrate a semiconductor manufacturing method in accordance with some embodiments of the present disclosure.
Figure 6B:
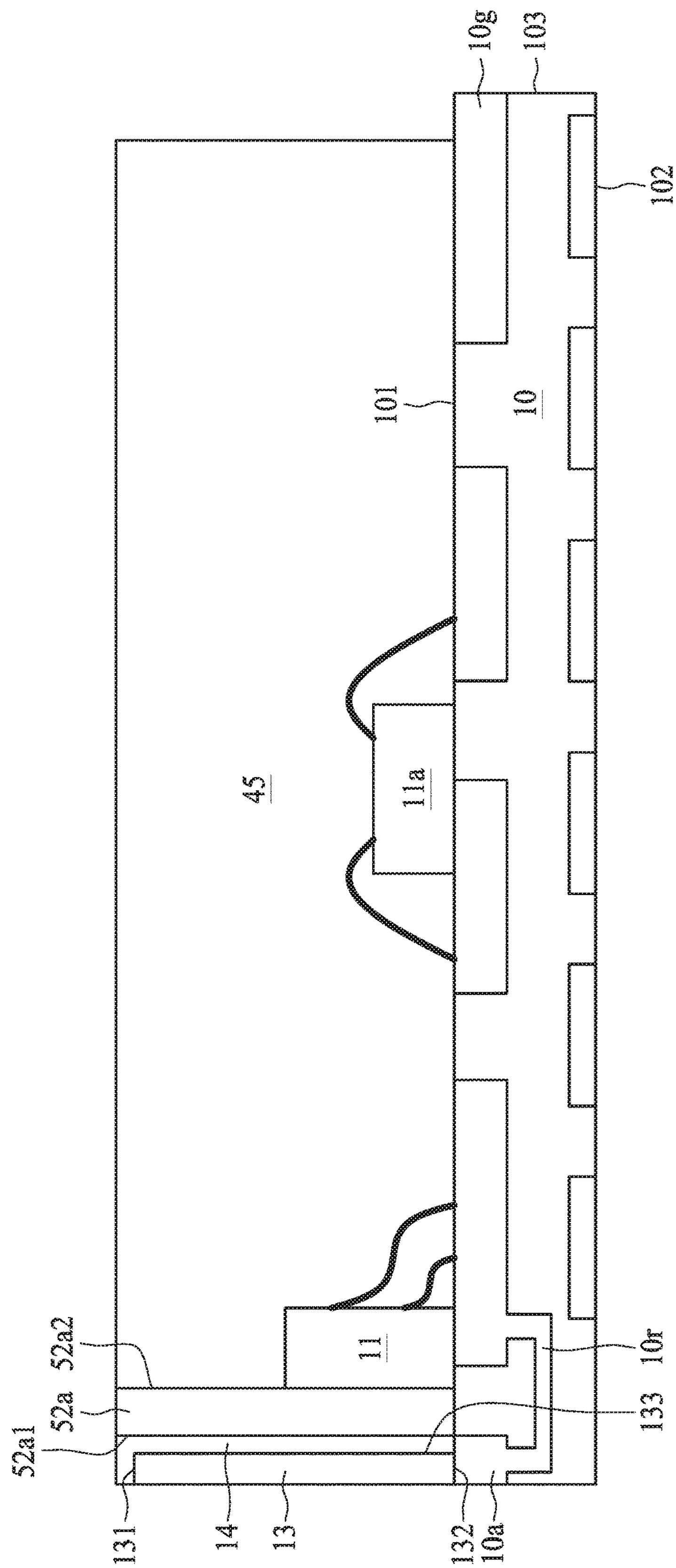
Figure 6C:
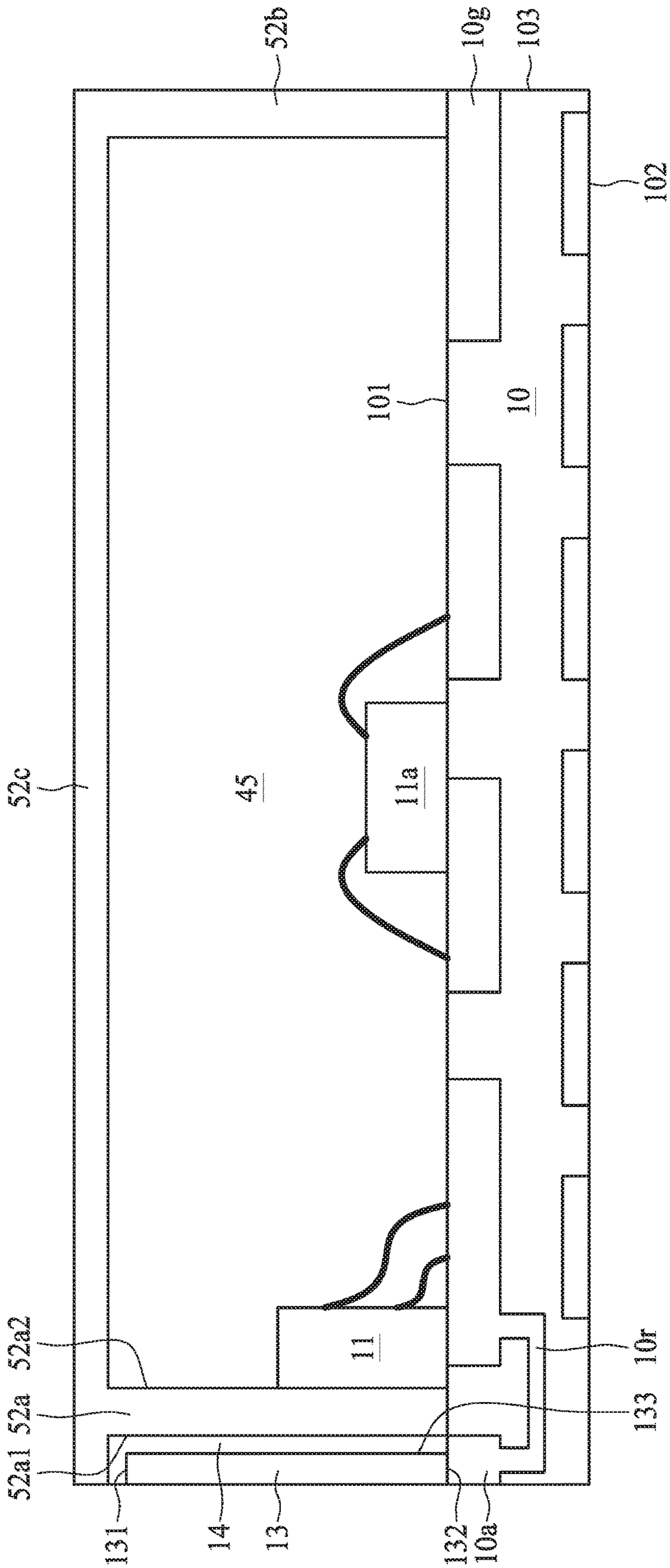

FIGS. 6A, 6B and 6C illustrate a semiconductor manufacturing method in accordance with some embodiments of the present disclosure.

Referring to FIG. 6A, a substrate 10 is provided. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10*r*, such as an RDL or a grounding element 10*g*.

A metal segment 52*a* with an insulating layer 14 and an antenna 13 attached thereto is formed or disposed on a surface 101 of the substrate 10. The antenna 13 is disposed on a first side 52*a*1 of the metal segment 52*a* and isolated from the metal segment 52*a* by the insulating layer 14. The insulating layer 14 is formed or disposed between the antenna 13 and the metal segment 52*a* and on a top surface 131 of the antenna 13. The bottom surface 132 of the antenna 13 is exposed from the insulating layer 14. The bottom surface 132 of the antenna 13 directly contacts a conductive pad 10*a* of the substrate 10. The antenna 13 is, or includes, a conductive material such as a metal or metal alloy. Examples of the conductive material include Au, Ag, Al, Cu, or an alloy thereof. In some embodiments, the metal segment 52*a* with the insulating layer 14 and the antenna 13 attached thereto can be formed by the following operations: (i) providing the antenna 13; (ii) forming or disposing the insulating layer 14 covering the antenna 13; (iii) removing a portion of the insulating layer 14 to expose the bottom surface 132 of the antenna 13; and (iv) attaching the insulting layer 14 to the first side 52*a*1 of the metal segment 52*a*.

Electronic components 11, 11*a* are formed or disposed on the surface 101 of the substrate 10. The electronic components 11, 11*a* may be active electronic components, such as ICs or dies or passive electronic components, such as capacitors, resistors or inductors. The electronic component 11*a* may be electrically connected to the substrate 10 (e.g., to the RDL) by way of flip-chip or wire-bond techniques.

The electronic component 11 is vertically formed or disposed on the surface 101 of the substrate 10 and adjacent to a second side 52*a*2 of the metal segment 52*a*. For example, a backside of the electronic component 11 is substantially parallel to the metal segment 52*a*. The electronic component 11 may be electrically connected to the substrate 10 (e.g., to the RDL) by wire-bond, conductive adhesive or solder balls.

Referring to FIG. 6B, a package body 45 can be formed or disposed on a portion of the surface 101 of the substrate 10 to cover or encapsulate the electronic components 11, 11*a*. Another portion of the surface 101 (including the grounding element 10*g*) of the substrate 10 is exposed from the package body 45. In some embodiments, the package body 45 includes an epoxy resin including fillers dispersed therein. The package body 45 may be formed or disposed by a molding technique, such as selective molding, transfer molding or compression molding.

Referring to FIG. 6C, a metal segment 52*b* is formed or disposed on the exposed portion of the surface 101 of the substrate 10. In some embodiments, the metal segment 52*b* is formed or disposed on the grounding element 10*g* of the substrate 10. The metal segment 52*c* is then formed or disposed on the package body 45 and the metal segments 52*a* and 52*b*. The metal segment 52*c* directly contacts the metal segments 52*a* and 52*b* to define a shielding layer. The metal segments 52*a*, 52*b*, 52*c* are conductive thin films, and may include, for example, Al, Cu, Cr, Sn, Au, Ag, Ni or stainless steel, or a mixture, an alloy, or other combination thereof. In some embodiments, the metal segments 52*a*, 52*b*, 52*c* are formed of the same material. Alternatively, the metal segments 52*a*, 52*b*, 52*c* are formed of different materials. In other embodiments, the operation shown in FIG. 6B (e.g., the formation of the package body 45) can be omitted depending on design specifications.

In some embodiments, to integrate an antenna into a semiconductor package device, the antenna pattern may be formed or disposed on the package body by sputtering conductive materials. However, such process may increase the difficulty for manufacturing the semiconductor package device. In accordance with some embodiments, forming or disposing the metal segment 52*a* with the antenna 13 attached thereto on the substrate 10 can simplify the process for manufacturing the semiconductor package device.

FIGS. 7A, 7B, 7C and 7D illustrate a semiconductor manufacturing method in accordance with some embodiments of the present disclosure.

Figure 7A:
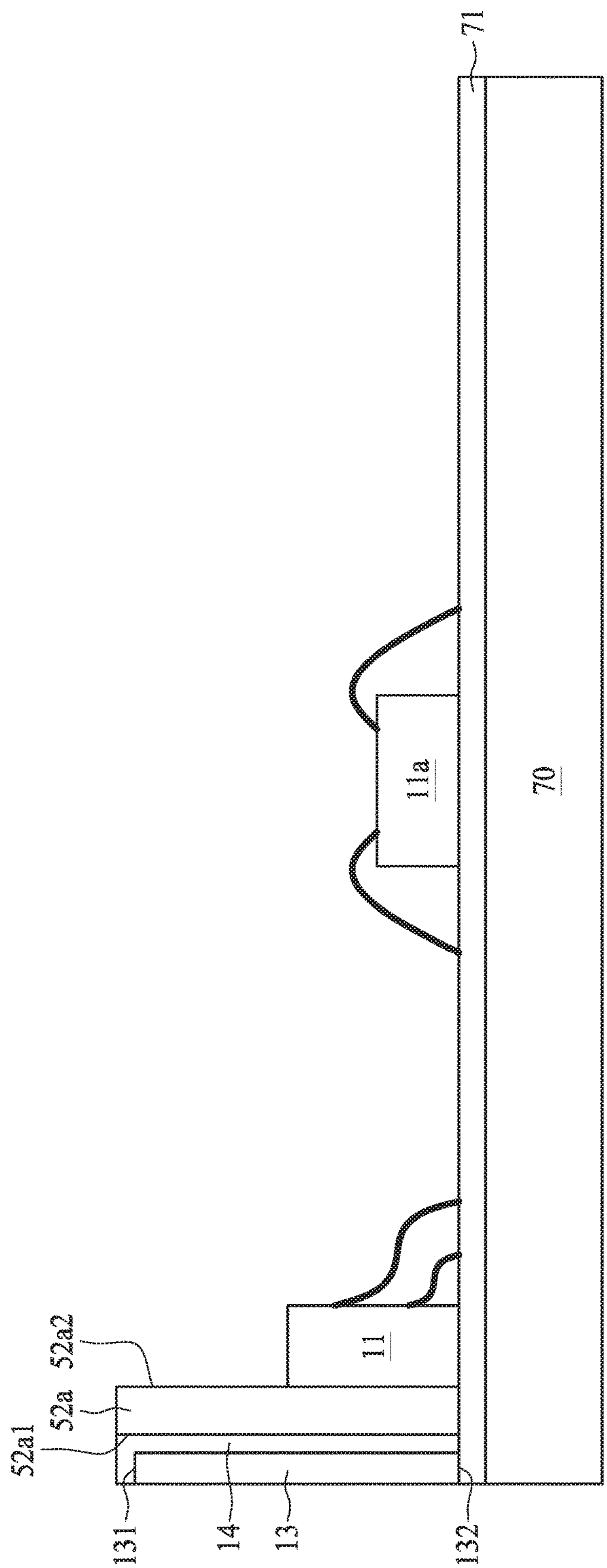
FIG. 7A, FIG. 7B, FIG. 7C and FIG. 7D illustrate a semiconductor manufacturing method in accordance with some embodiments of the present disclosure.

Referring to FIG. 7A, a carrier 70 with an adhesive layer 71 disposed thereon is provided. A metal segment 52*a* with an insulating layer 14 and an antenna 13 attached thereto is formed or disposed on the carrier 70 via the adhesive layer 71. The antenna 13 is disposed on a first side 52*a*1 of the metal segment 52*a* and isolated from the metal segment 52*a* by the insulating layer 14. The insulating layer 14 is formed or disposed between the antenna 13 and the metal segment 52*a* and on a top surface 131 of the antenna 13. The bottom surface 132 of the antenna 13 is exposed from the insulating layer 14. The bottom surface 132 of the antenna 13 directly contacts the adhesive layer 71. The antenna 13 is, or includes, a conductive material such as a metal or metal alloy. Examples of the conductive material include Au, Ag, Al, Cu, or an alloy thereof.

Electronic components 11, 11*a* are formed or disposed on the carrier 70 by the adhesive layer 71. The electronic components 11, 11*a* may be active electronic components, such as ICs or dies or passive electronic components, such as capacitors, resistors or inductors. The electronic component 11 is vertically formed or disposed on the carrier 70 and adjacent to a second side 52*a*2 of the metal segment 52*a*. For example, a backside of the electronic component 11 is substantially parallel to the metal segment 52*a*.

Figure 7B:
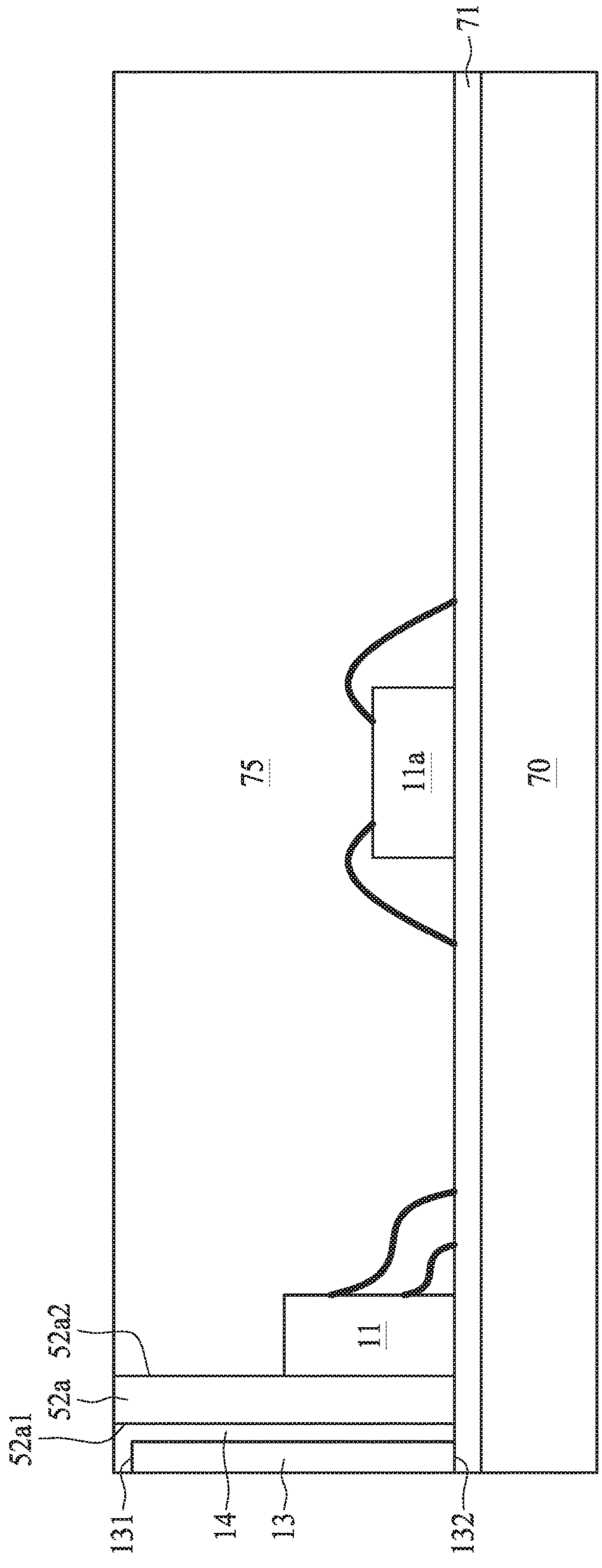

Referring to FIG. 7B, a package body 75 is formed or disposed on the carrier 70 and encapsulates the electronic components 11, 11*a* and the second side 52*a*2 of the metal segment 52*a*. The package body 75 exposes a top surface of the metal segment 52*a* and a top surface of the insulating layer 14. In some embodiments, the package body 75 includes an epoxy resin including fillers dispersed therein. The package body 75 may be formed or disposed by a molding technique, such as selective molding, transfer molding or compression molding.

Figure 7C:
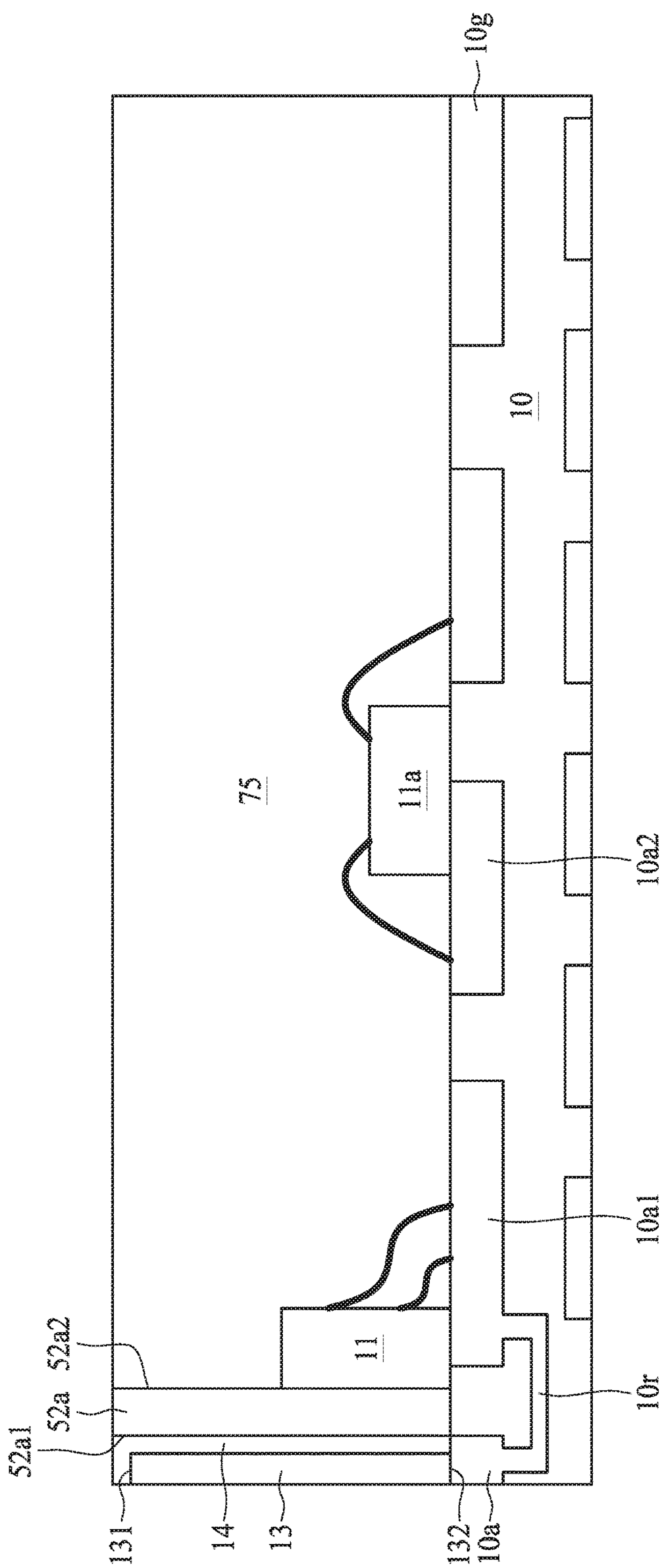

Referring to FIG. 7C, the carrier 70 is removed from the package body 75, and the package body 75 is then attached to the substrate 10. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure 10*r*, such as an RDL or a grounding element 10*g*. The bottom surface 132 of the antenna 13 directly contacts the conductive pad 10*a* on the substrate 10. The electrical contacts of the electronic components 11, 11*a* directly contact conductive pads (e.g., second conductive contacts) 10*a*1, 10*a*2 on the substrate 10.

Figure 7D:
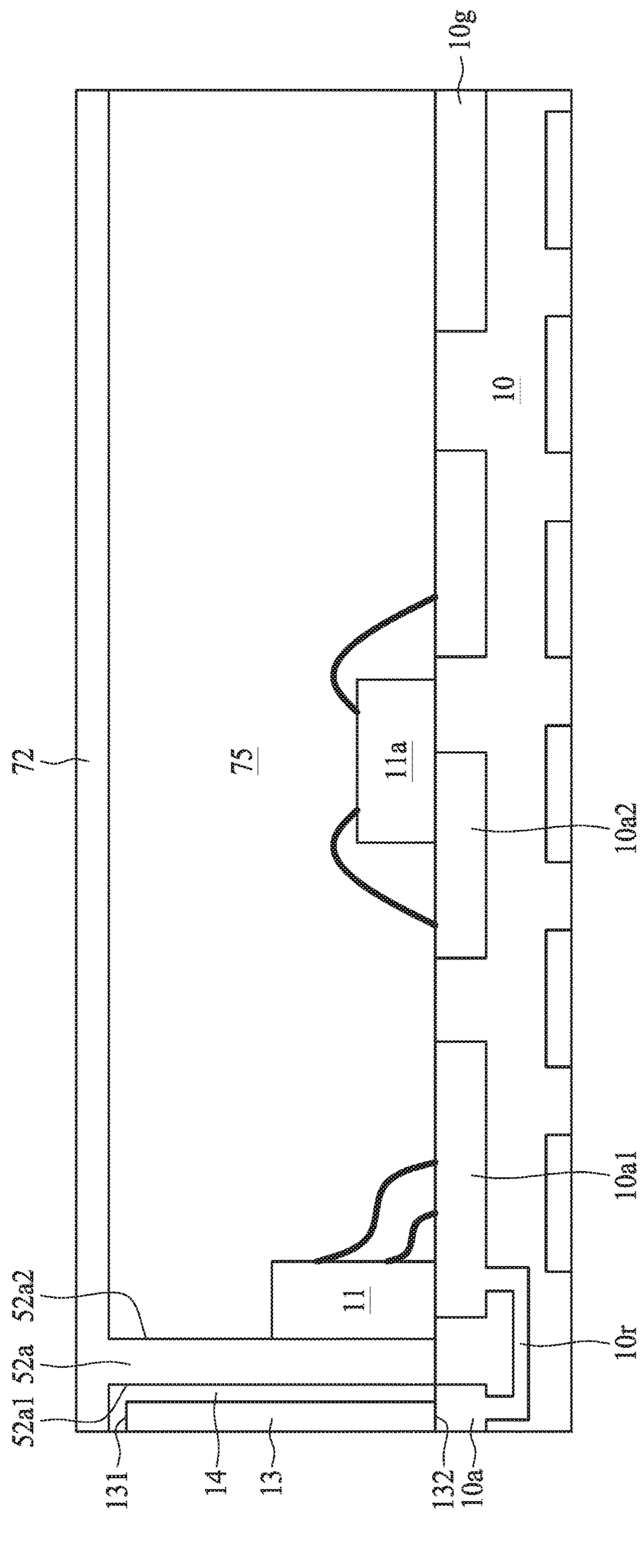

Referring to FIG. 7D, a metal segment 72 is disposed on the package body 75, the top surface of the metal segment 52*a* and the top surface of the insulating layer 14. The metal segment 72 electrically connects to the top surface of the metal segment 52*a* to define a shielding layer.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. Two surfaces or components can be deemed to be "substantially parallel" if an angle therebetween is, for example, 0°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

In the description of some embodiments, a component provided "on" another component can encompass cases where the former component is directly on (e.g., in physical contact with) the latter component, as well as cases where one or more intervening components are located between the former component and the latter component.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package device, comprising:

a substrate having a first surface, a second surface opposite to the first surface, and a lateral surface, and comprising a first conductive contact;

an electronic component disposed on the first surface of the substrate;

a metal frame disposed on the first surface of the substrate; and an antenna disposed on the metal frame, wherein the antenna is electrically isolated from the metal frame and electrically connected to the first conductive contact of the substrate, and the antenna has an outer lateral surface substantially coplanar with the lateral surface of the substrate.

2. The semiconductor package device of claim 1, wherein the metal frame includes a first portion disposed on the first surface of the substrate and adjacent to the electronic component and a second portion connected to the first portion and located above the electronic component.

3. The semiconductor package device of claim 2, further comprising an insulating layer disposed on the first portion of the metal frame and between the antenna and the first portion of the metal frame.

4. The semiconductor package device of claim 3, wherein:

the antenna has a top surface, a bottom surface opposite to the top surface, and a lateral surface extending between the top surface and the bottom surface and opposite to the outer lateral surface;

the top surface and the lateral surface of the antenna are covered by the insulating layer; and the bottom surface of the antenna is exposed from the insulating layer and directly contacts the first conductive contact of the substrate.

5. The semiconductor package device of claim 3, wherein:

the metal frame comprises a third portion disposed on the first surface of the substrate and extending substantially parallel to the first portion;

the insulating layer is disposed on the first portion, the second portion and the third portion of the metal frame; and the antenna is disposed on the insulating layer.

6. The semiconductor package device of claim 2, further comprising:

a package body disposed on the first surface of the substrate and covering the electronic component; and a shielding layer disposed on a top surface of the package body and contacting the first portion of the metal frame, wherein the first portion of the metal frame is disposed adjacent to a lateral surface of the package body.

7. The semiconductor package device of claim 6, further comprising an insulating layer, wherein the antenna is electrically isolated from the shielding layer by the insulating layer.

8. The semiconductor package device of claim 1, wherein the substrate comprises an electrical connection therein and the electronic component is disposed on a second conductive contact and the antenna is electrically connected to the electronic component through the first conductive contact, the second conductive contact and the electrical connection within the substrate.

9. The semiconductor package device of claim 8, wherein an active surface of the electronic component is substantially perpendicular to the first surface of the substrate and the active surface is electrically connected to the second conductive contact on the substrate through a wire, a solder ball or a conductive adhesive.

10. The semiconductor package device of claim 1, wherein the substrate comprises a grounding segment and the metal frame is connected to the grounding segment of the substrate.

11. The semiconductor package device of claim 1, wherein:

the first conductive contact is exposed from the lateral surface of the substrate; and the antenna extends along the lateral surface of the substrate and contacts the first conductive contact.

12. The semiconductor package device of claim 1, wherein the substrate includes a printed circuit board or a redistribution layer.

13. A method of manufacturing a semiconductor package device, comprising:

providing a substrate including a first surface, a second surface opposite to the first surface, and a lateral surface;

disposing an electronic component on the first surface of the substrate; and attaching a metal frame, on which an antenna is disposed and from which the antenna is electrically isolated, on the first surface of the substrate through a first conductive contact so that the antenna is electrically connected to the substrate through the first conductive contact, wherein the antenna has an outer lateral surface substantially coplanar with the lateral surface of the substrate.

14. The method of claim 13, wherein attaching the metal frame comprises:

connecting the antenna to the first conductive contact of the substrate; and connecting the metal frame to a grounding segment of the substrate.

15. The method of claim 13, wherein disposing the electronic component comprises:

disposing a side surface extending between an active surface and a back surface of the electronic component on the first surface of the substrate; and connecting the active surface of the electronic component to the first surface of the substrate through a wire, a solder ball or a conductive adhesive.

16. The method of claim 13, further comprising:

disposing a package body on the first surface of the substrate to cover the electronic component, wherein a lateral surface of the package body is disposed adjacent to the metal frame; and disposing a shielding layer on a top surface of the package body, wherein the shielding layer contacts the metal frame.

17. The semiconductor package device of claim 1, wherein the antenna is an array antenna or a patch antenna.

18. The semiconductor package device of claim 2, wherein the second portion of the metal frame extends above the antenna.

19. The method of claim 13, wherein the antenna is an array antenna or a patch antenna.

* * * * *